(12) United States Patent
Navala et al.

(10) Patent No.: US 7,052,583 B2
(45) Date of Patent: May 30, 2006

(54) MAGNETRON CATHODE AND MAGNETRON SPUTTERING APPARATUS COMPRISING THE SAME

(75) Inventors: Sergiy Yakovlevich Navala, Suwon-si (KR); Yuri Nikolaevich Tolmachev, Suwon-si (KR); Dong-joon Ma, Anyang-si (KR); Tae-wan Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 118 days.

(21) Appl. No.: 10/755,452

(22) Filed: Jan. 13, 2004

(65) Prior Publication Data

US 2004/0140204 A1    Jul. 22, 2004

(30) Foreign Application Priority Data

Jan. 15, 2003    (KR) .................. 10-2003-0002731

(51) Int. Cl.
*C23C 14/00*    (2006.01)
(52) U.S. Cl. .................. 204/192.12; 204/298.21; 204/298.16; 204/298.37
(58) Field of Classification Search ........... 204/192.12, 204/192.15, 298.12, 298.13, 298.19, 298.21, 204/298.23, 298.26, 298.16, 298.37; 335/296, 335/302, 306
See application file for complete search history.

(56) References Cited

U.S. PATENT DOCUMENTS

| | | | | |
|---|---|---|---|---|
| 4,407,713 A * | 10/1983 | Zega | ..................... | 204/298.22 |
| 4,904,362 A * | 2/1990 | Gaertner et al. | ........ | 204/192.12 |
| 5,171,411 A * | 12/1992 | Hillendahl et al. | .... | 204/192.12 |
| 5,382,344 A * | 1/1995 | Hosokawa et al. | ...... | 204/298.2 |
| 5,656,138 A * | 8/1997 | Scobey et al. | ......... | 204/192.12 |
| 2003/0019739 A1* | 1/2003 | Shibamoto et al. | ...... | 204/192.2 |
| 2003/0178299 A1* | 9/2003 | Shin et al. | ............... | 204/298.2 |
| 2003/0209431 A1* | 11/2003 | Brown | .................. | 204/298.19 |

* cited by examiner

*Primary Examiner*—Haissa Philogene
(74) *Attorney, Agent, or Firm*—Lee & Morse, P.C.

(57) ABSTRACT

A magnetron cathode and a sputtering apparatus including the same are provided. The magnetron cathode includes three or more magnet units, each of which comprises a single magnet or a plurality of magnets having the same poles facing toward the same direction, wherein one magnet unit is disposed around the outer circumference of another magnet unit and adjacent magnet units have opposite poles facing toward the same direction. Uniform magnetic field distribution is obtained. Therefore, the erosion profile of a target is wide and uniform.

17 Claims, 9 Drawing Sheets

DISTANCE FROM THE CENTER
OF A MAGNETRON CATHODE (mm)

DISTANCE FROM THE
CENTER OF A TARGET (mm)

MAGNETRON CATHODE AND MAGNETRON SPUTTERING APPARATUS COMPRISING THE SAME

BACKGROUND OF THE INVENTION

1. Field of the Invention

The present invention relates to a magnetron sputtering apparatus, and more particularly, to a magnetron sputtering apparatus with improvements in deposition rate and film uniformity.

2. Description of the Related Art

Generally, physical vapor deposition (PVD) and chemical vapor deposition (CVD) are widely used for the deposition of films with a small thickness. The CVD is a process that forms thin films with desired physical properties using chemical reaction. The PVD is a process that forms thin films by imparting a momentum to target materials in order for the target materials to travel toward a substrate.

The PVD can be largely classified into magnetron sputtering and evaporation. The evaporation is a method that heats a solid or a liquid to be decomposed into molecules or atoms and then solidifies them on a surface of a substrate. The evaporation has been widely used because an apparatus therefor has a simple structure and a large amount of evaporation materials can be easily used.

The sputtering is a method that leads to collision of high-energy particles with sputtering targets to deposit materials ejected from the sputtering targets on a substrate. The sputtering has advantages in that thin films can be formed to a uniform thickness over a wide area, and the composition ratio of alloy thin films can be easily adjusted compared to other deposition processes. Therefore, the sputtering has been widely used in fabrication of semiconductor devices such as dynamic random access memory (DRAM), static RAM (SRAM), nonvolatile memory (NVM), and LOGIC, or other electronic devices.

Magnetron sputtering using a magnetic field can be carried out in a reaction chamber having a process condition of a low pressure and high-density plasma. Therefore, sputtering particles can easily advance forward, and thus, can be efficiently deposited even on stepped portions, thereby enhancing step coverage.

FIG. 1 is a schematic sectional view of a conventional magnetron sputtering apparatus.

Referring to FIG. 1, a substrate 17 and a substrate holder 19 supporting the substrate are disposed in a vacuum chamber 21. A target 11 is disposed on the opposite side from the substrate 17. Magnets 15 are disposed behind the target 11 to form magnetic field lines of predetermined directions. In addition, a power supply unit 27 is disposed outside the vacuum chamber 21 to apply a voltage to an electrode 13 on which the target 11 is disposed.

When a predetermined vacuum is maintained in the chamber 21, an inlet gas such as argon is supplied to in the chamber 21 and electric discharge occurs by a negative voltage applied to the electrode 13. As a result, plasma consisting of gaseous ions, neutral molecules, and electrons is generated. The gaseous ions are accelerated by a negative voltage and collide with the target 11. Due to the collision, surface atoms of the target 11 gain momentum, thereby resulting in ejection of the surface atoms from the target 11. Therefore, the ejected atoms are deposited in a thin film on the substrate 17. In this case, the thickness of the deposited thin film is determined by an applied voltage, pressure, a deposition time, and the like.

However, it is known that it is difficult to efficiently control the momentum of charged particles, determining the sputtering efficiency in magnetron sputtering. When a horizontal magnetic field is concentrated on a specific area, the target 11 is non-uniformly eroded and the particles of the target 11 are also deposited to a non-uniform thickness on the substrate 17. In addition, although demands for highly integrated devices, narrow line width, and large process wafers increase continuously, it is difficult to satisfy such demands using a sputtering apparatus comprising a conventional magnetron cathode.

It is reported that a magnetron sputtering process using a magnetron moving system provides excellent film uniformity. However, a conventional magnetron cathode exhibits non-uniform magnetic field distribution, as shown in FIG. 2. FIG. 2 shows the magnetic field line distribution of a conventional magnetron cathode.

Referring to FIG. 2, a magnetron cathode has a width of 24 mm and is disposed behind a target having a width of about 40 mm. While the density of magnetic field lines originating from the magnetron cathode is high at the center area of the magnetron cathode, it decreases as the lines it goes away from the center area. The density of magnetic field lines is the highest at a 12 mm radial distance ($r=12$ mm) from the axial line ($r=0$) of the magnetron cathode, thereby producing the highest magnetic field. At the surface of the target, i.e., when z is 6 mm, the density of magnetic field lines is the highest at $r=0$ at which the intensity of magnetic field is maximal. As r increases, the density of magnetic field decreases. Therefore, the surface of the target exhibits non-uniform magnetic field line distribution. Such non-uniform magnetic field line distribution leads to an non-uniform erosion profile as shown in FIG. 3.

FIG. 3 is a graph of an erosion profile according to a distance from the center ($x=0$) of a target using the magnetron cathode of FIG. 2. In detail, FIG. 3 shows a change in erosion profile according to a distance from the center of the target at varying erosion powers of (a) 0.027 $kWhcm^{-2}$, (b) 0.051 $kWhcm^{-2}$, and (c) 0.099 $kWhcm^{-2}$.

Referring to FIG. 3, all of the graphs (a), (b), and (c) exhibits the deepest erosion profile at a 3 cm distance from the center ($x=0$) of the target. As an erosion power increases, the target is more deeply eroded. Here, comparative values to the distance X are represented at the top of the graph.

FIG. 4 is a photograph of a target eroded in a conventional sputtering apparatus comprising a conventional magnetron cathode.

Referring to FIG. 4, a narrow, ring-shaped erosion area is observed. In the erosion area, the degree of erosion is high relative to the other areas of the target, thereby resulting in unbalanced erosion profile.

Such a magnetron cathode technology has following problems in a current sputtering process requiring a small line width (0.14 μm or less) and high aspect ratio (5:1 or more): deposition occurs asymmetrically, film uniformity is poor, and target erosion occurs locally, thereby decreasing the efficiency of materials used.

SUMMARY OF THE INVENTION

The present invention provides a magnetron cathode which provides uniform erosion of a target, thereby enhancing deposition rate and film uniformity, and a magnetron sputtering apparatus comprising the magnetron cathode.

According to an aspect of the present invention, there is provided a magnetron cathode comprising three or more magnet units, each of which comprises a single magnet, wherein one magnet unit is disposed around the outer circumference of another magnet unit and adjacent magnet units have opposite poles facing toward the same direction.

The magnet units may be symmetrically disposed around the same axis.

The innermost magnet unit may have a hollow cavity inside thereof.

Each of the magnet units may be formed in a circular or polygonal shape.

Each of the magnet units may comprise a plurality of magnets having the same poles facing toward the same direction.

According to another aspect of the present invention, there is provided a magnetron sputtering apparatus comprising: a first electrode on which a substrate is disposed; a target facing the substrate and made of a material to be deposited on the substrate; a second electrode disposed on the rear surface of the target; a magnetron cathode disposed behind the second electrode and comprising three or more magnet units, each of which comprises a single magnet, wherein one magnet unit is disposed around the outer circumference of another magnet unit and adjacent magnet units have opposite poles facing toward the same direction; and a support member supporting the magnetron cathode.

The magnet units may be symmetrically disposed around the same axis.

The innermost magnet unit may have a hollow cavity defined by the support member inside thereof.

The magnetron sputtering apparatus may further comprise a cooling tube in which cooling water flows, which is disposed in the hollow cavity.

Each of the magnet units may be formed in a circular or polygonal shape.

Each of the magnet units may comprise a plurality of magnets having the same poles facing toward the same direction.

The substrate may be disposed as close to the target as the ¼ or less of the width of the target.

The magnetron sputtering apparatus may further comprise a nozzle, which is disposed near the target to supply an inert gas.

The first electrode may be an anode and the second electrode may be a cathode.

The present invention provides a magnet structure of the three or more magnet units. Therefore, uniform magnetic field distribution is ensured.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Korean Patent Application No. 2003-2731, filed on Jan. 15, 2003, and entitled: "Magnetron Cathode and Magnetron Sputtering Apparatus Comprising the Same," is incorporated by reference herein in its entirety.

Hereinafter, a magnetron cathode and a magnetron sputtering apparatus comprising the same according to the present invention will be described in detail with reference to the accompanying drawings.

Figure 5:
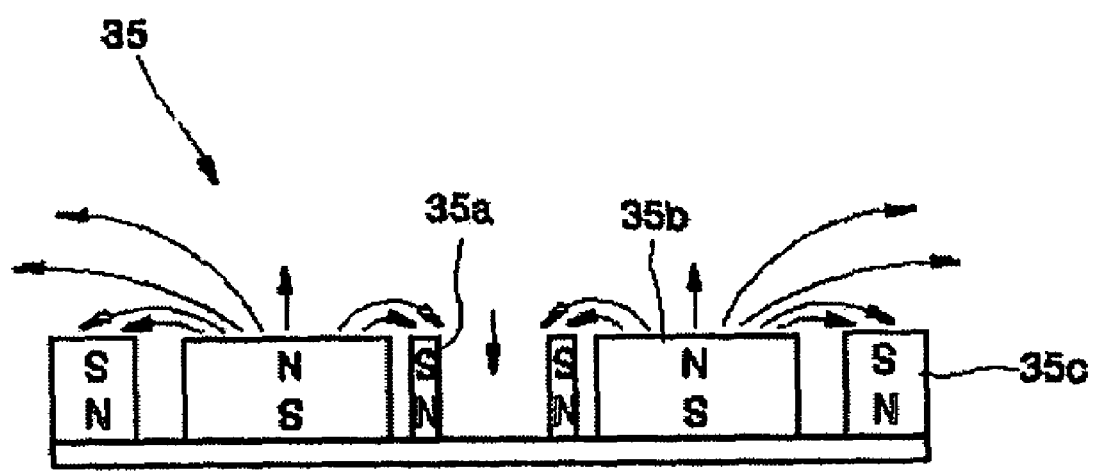
FIG. 5 is a schematic sectional view of a magnetron cathode according to the present invention.

FIG. 5 is a schematic sectional view of a magnetron cathode according to the present invention.

Referring to FIG. 5, a magnetron cathode according to the present invention comprises three or more magnet units, each of which comprises a single magnet or a plurality of magnets having the same poles facing toward a target. Adjacent magnet units have opposite poles facing toward the target. One magnet unit is disposed around the outer circumference of another magnet unit. For example, as shown in FIG. 5, a first magnet unit 35a is disposed at the innermost area in such a way that an S pole faces toward the target, a second magnet unit 35b is disposed around the outer circumference of the first magnet unit 35a in such a way that an N pole faces toward the target, and a third magnet unit 35c is disposed around the outer circumference of the second magnet unit 35b in such a way that an S pole faces toward the target. The first magnet unit 35a has a hollow cavity inside thereof. The hollow cavity serves as a passage through which cooling water flows when a magnetron cathode is installed in a sputtering apparatus.

Magnetic field lines emanate from the second magnet unit 35b and then enter into the first and third magnet units 35a and 35c. Since a magnetron cathode according to the present invention can comprise a plurality of magnets, more uniform magnetic field line distribution can be ensured, relative to a conventional magnetron cathode.

Figure 6A:
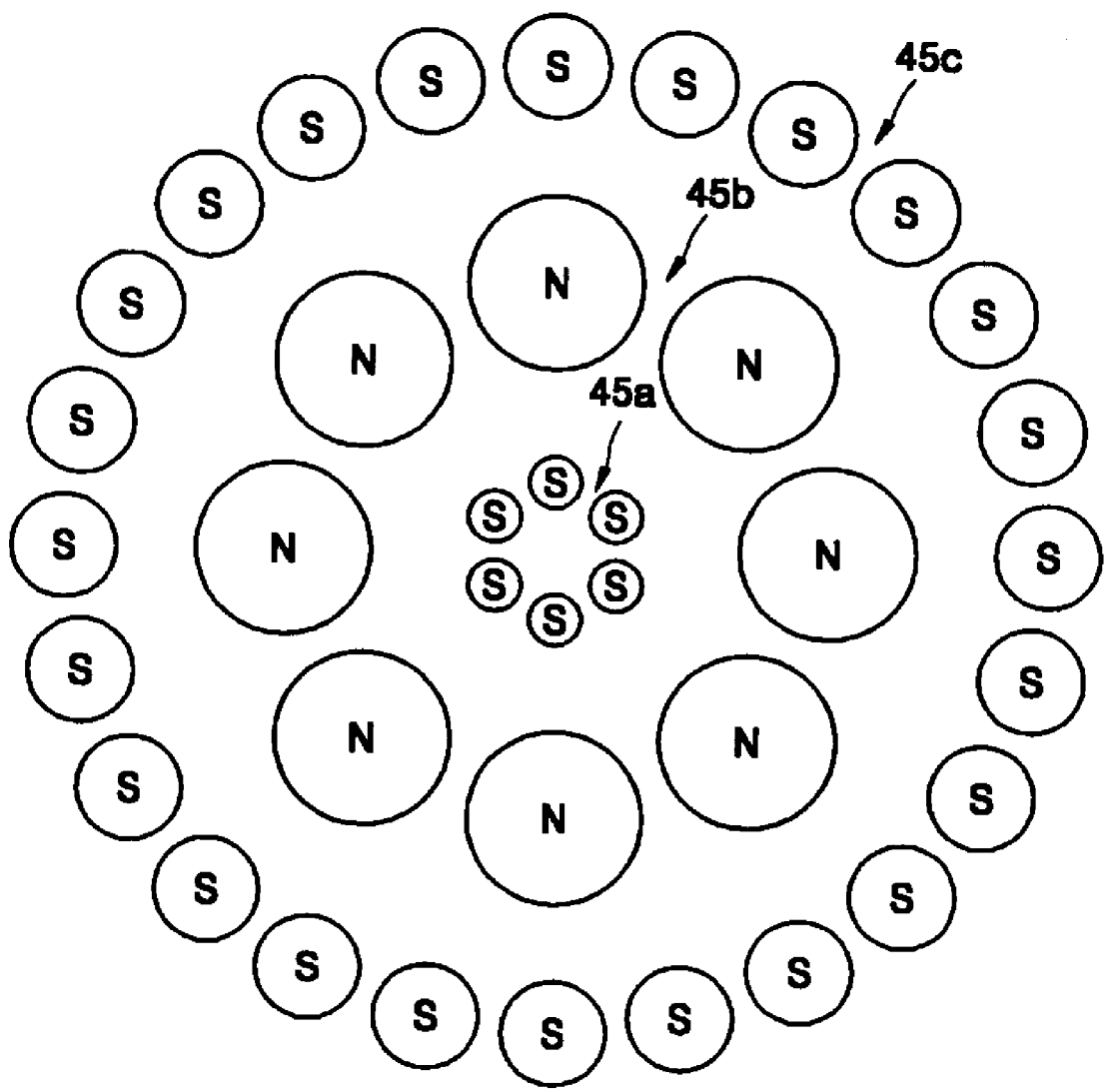
FIG. 6A is a schematic plan view of an example of a magnetron cathode according to the present invention.
Figure 6B:
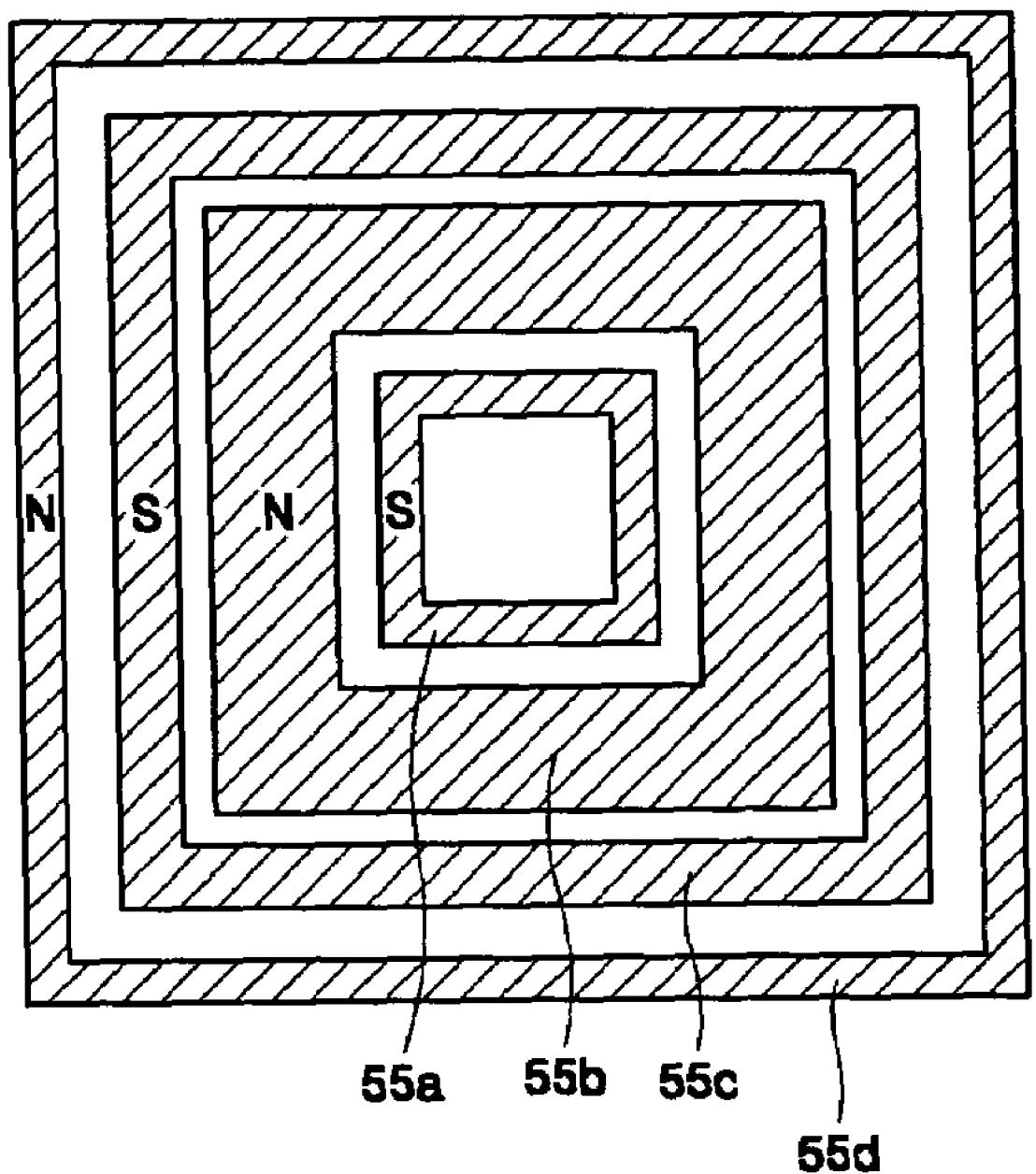
FIG. 6B is a schematic plan view of another example of a magnetron cathode according to the present invention.

FIGS. 6A and 6B show examples of a magnetron cathode according to the present invention.

Referring to FIG. 6A, a magnetron cathode assembly of the present invention comprises first through third magnet units 45a, 45b, and 45c, each of which comprises a plurality of magnets having the same poles facing toward the same direction and which is arranged in a circular shape. Such a magnet distribution ensures more uniform magnetic field distribution.

Referring to FIG. 6B, a magnetron cathode of the present invention comprises first through fourth magnet units 55a, 55b, 55c, and 55d, each of which is arranged in a rectangular shape. Adjacent magnet units have opposite poles facing toward the same direction. Although FIG. 6B shows each of the magnet units comprised of a single magnet, each of the magnet units may comprises a rectangular array of a plurality of magnets, like in FIG. 6A. As shown in FIGS. 6A and 6B, a magnetron cathode according to the present invention can be manufactured in various patterns. That is, one magnetic unit may comprise a single magnet or a plurality of magnets and may be formed in a circular or polygonal shape.

Figure 7:
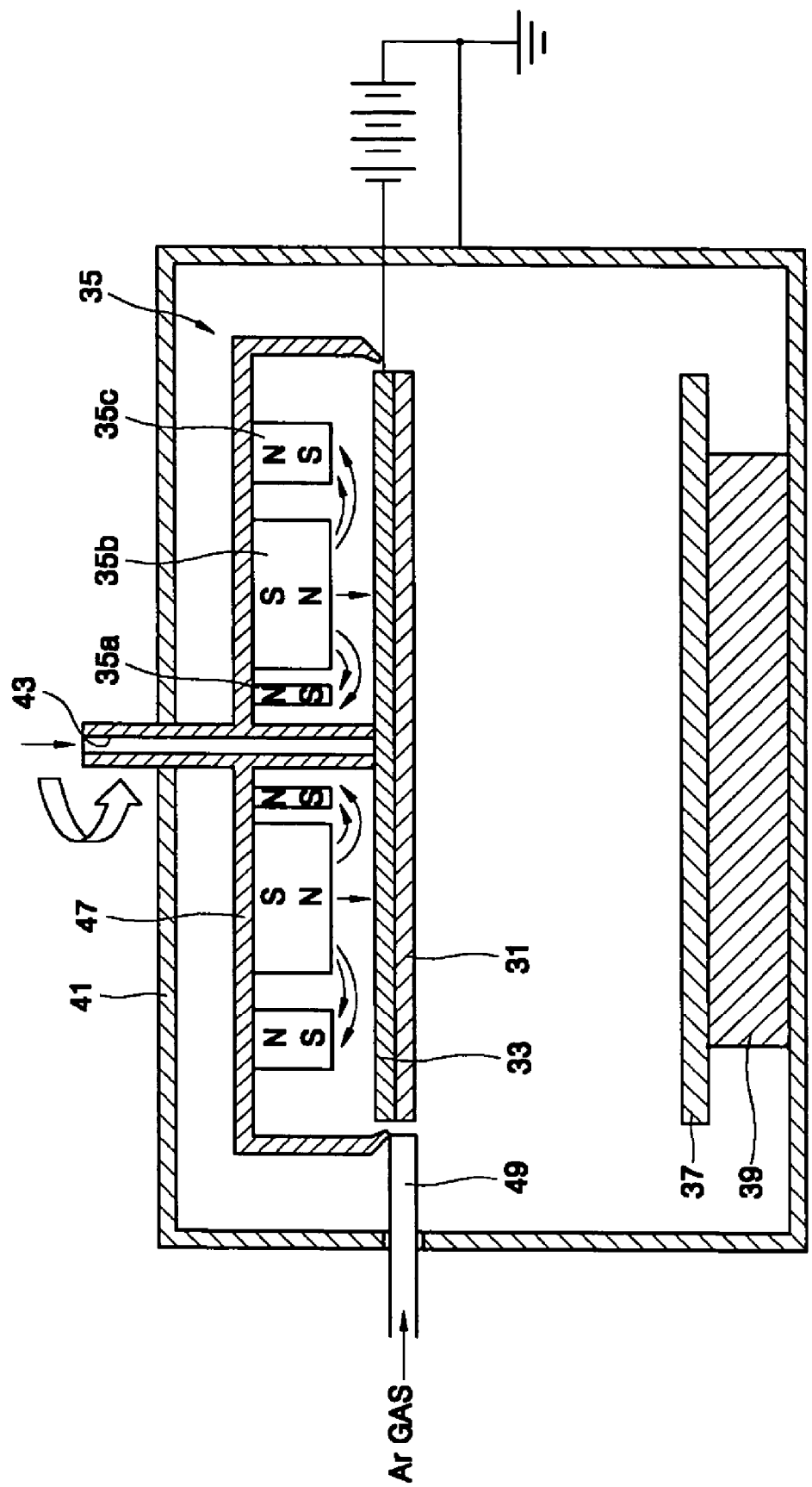
FIG. 7 is a schematic sectional view of a magnetron sputtering apparatus according to the present invention.

FIG. 7 is a schematic sectional view of a magnetron sputtering apparatus according to the present invention. The magnetron sputtering apparatus of FIG. 7 comprises the magnetron cathode of FIG. 5 according to the present invention.

Referring to FIG. 7, a magnetron sputtering apparatus comprises a vacuum chamber 41, an anode 39 on which a substrate 37 is disposed, being disposed in the vacuum chamber 41, a target 31 facing the substrate 37 and made of a material to be deposited on the substrate 37, a cathode 33 disposed on the rear surface of the target 31, a magnetron cathode 35 disposed behind the target 31, and a support member 47 supporting the magnetron cathode 35. The magnetron cathode 35 comprises a first magnet unit 35a disposed at the innermost area, a second magnet unit 35b disposed around the outer circumference of the first magnet unit 35a in such a way that a pole opposite to the first magnet unit faces toward the target, and a third magnet unit 35c disposed around the outer circumference of the second magnet unit 35b in such a way that a pole opposite to the second magnet unit faces toward the target.

When the support member 47 rotates against the substrate 37, the magnetron cathode 35 inside the support member rotates together with the support member. Due to uniform magnetic field distribution of the magnetron cathode 35, generated plasma is confined near the cathode 33. Therefore, a change of plasma distribution by the rotation of the magnetron cathode 35 is insignificant, thereby affecting no erosion profile characteristics. A cooling tube 43 in which cooling water flows is disposed in a hollow cavity defined by the support member 47. The cooling tube serves to control the temperature of the cathode 33 during a sputtering process. Cooling water passes through the cooling tube disposed in the hollow cavity of the magnetron cathode 35 and then cools the cathode 33. Therefore, sputtering can be carried out at a high deposition rate while a high power is applied.

A sputtering apparatus according to the present invention may further comprise a gas nozzle 49, which is disposed near the cathode 33, to supply a reaction gas such as argon. Therefore, plasma can be more efficiently generated.

A magnetron cathode according to the present invention has uniform magnetic field distribution as described above. Therefore, plasma can be confined as close as possible to the surface of the target 31. In this regard, the proximity of the target 31 and the substrate 37 can increase a deposition rate. Such a short-distance deposition process does not adversely affect magnetic field distribution and erosion profile characteristics even when the magnetron cathode rotates.

In addition, according to the present invention, the cathode and the anode may be upside down, unlike a conventional magnetron sputtering equipment structure, wherein the cathode (also called as "target electrode") is disposed at the upper side of the equipment and the anode (also called as "substrate electrode") is disposed at the lower side of the equipment.

Figure 8:
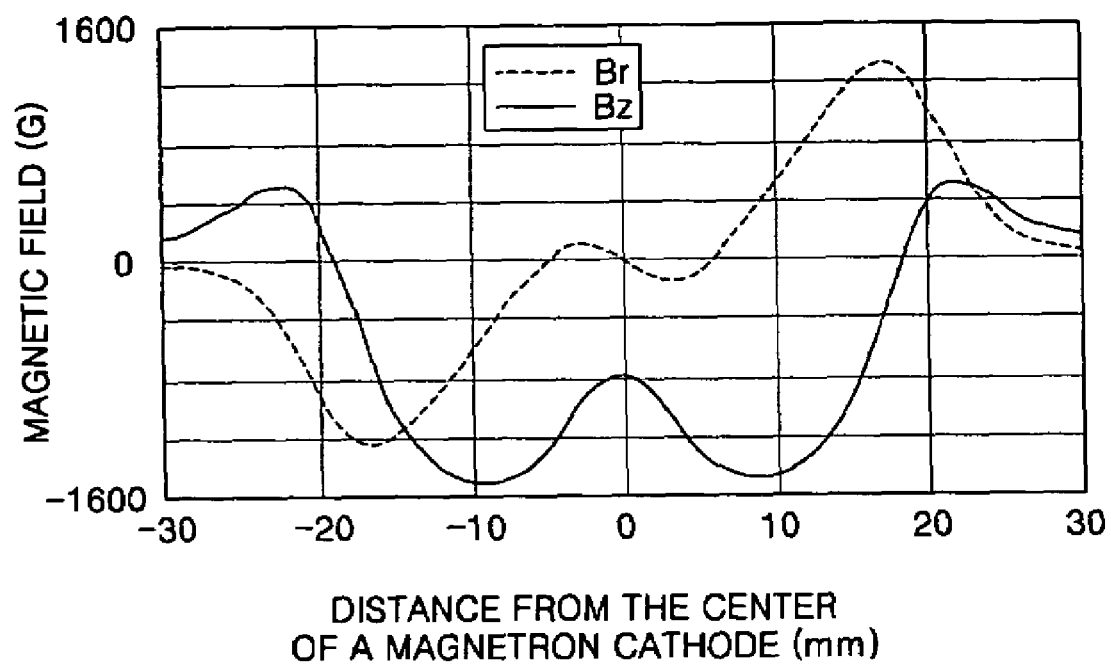
FIG. 8 is a graph of a magnetic field distribution according to a distance from the center of a magnetron cathode according to the present invention.

FIG. 8 is a graph of a magnetic field distribution according to a distance from the center of a magnetron cathode according to the present invention. Br represents the radial component of magnetic field. Bz represents the magnetic field component in Z-axis direction, i.e., a direction perpendicular to the surface of the magnetron cathode. As seen from FIG. 8, the Br is maximal at a 18 mm distance from the center of the magnetron cathode and the Bz is maximal at a 9–10 mm distance from the surface of the magnetron cathode. In this regard, it is supposed from the graph Br that the erosion of a target profile occurs most frequently at a distance of 18 mm from the center of the magnetron cathode.

Figure 9:
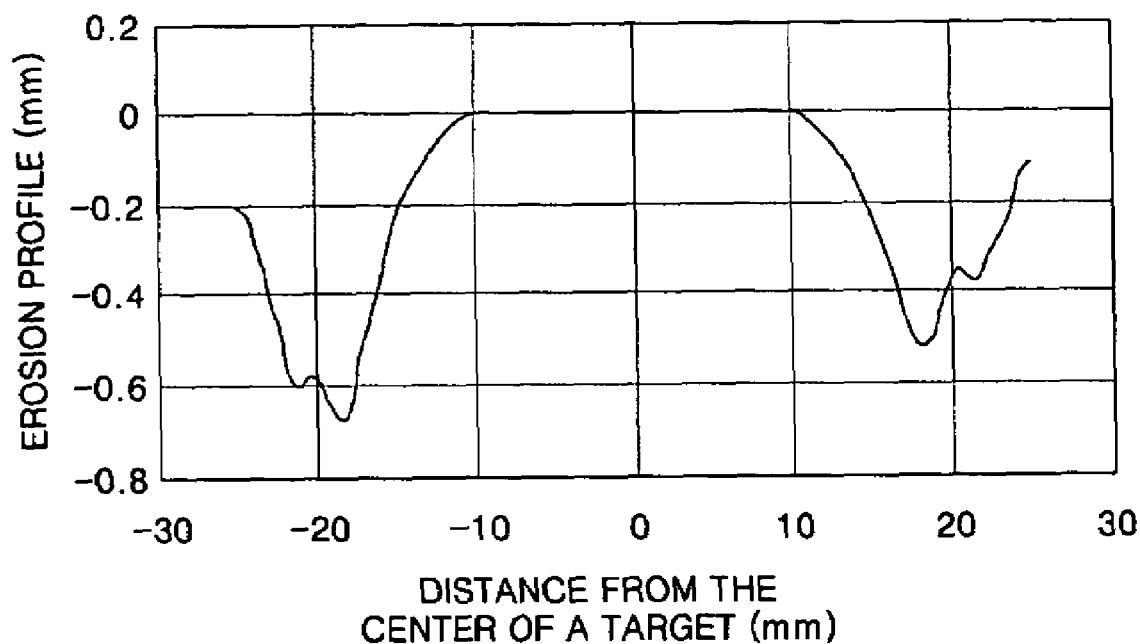
FIG. 9 is a graph of a change in erosion profile according to a distance from the center of a target in a magnetron sputtering apparatus according to the present invention.

FIG. 9 is a graph of a change in erosion profile according to a distance from the center of a target in a magnetron sputtering apparatus according to the present invention.

Referring to FIG. 9, a target is eroded to a depth of 0.7 mm at a distance of 18 mm from the center of the target. Erosion is deeply carried out at a distance of 18–22 mm from the center of the target.

Figure 10:
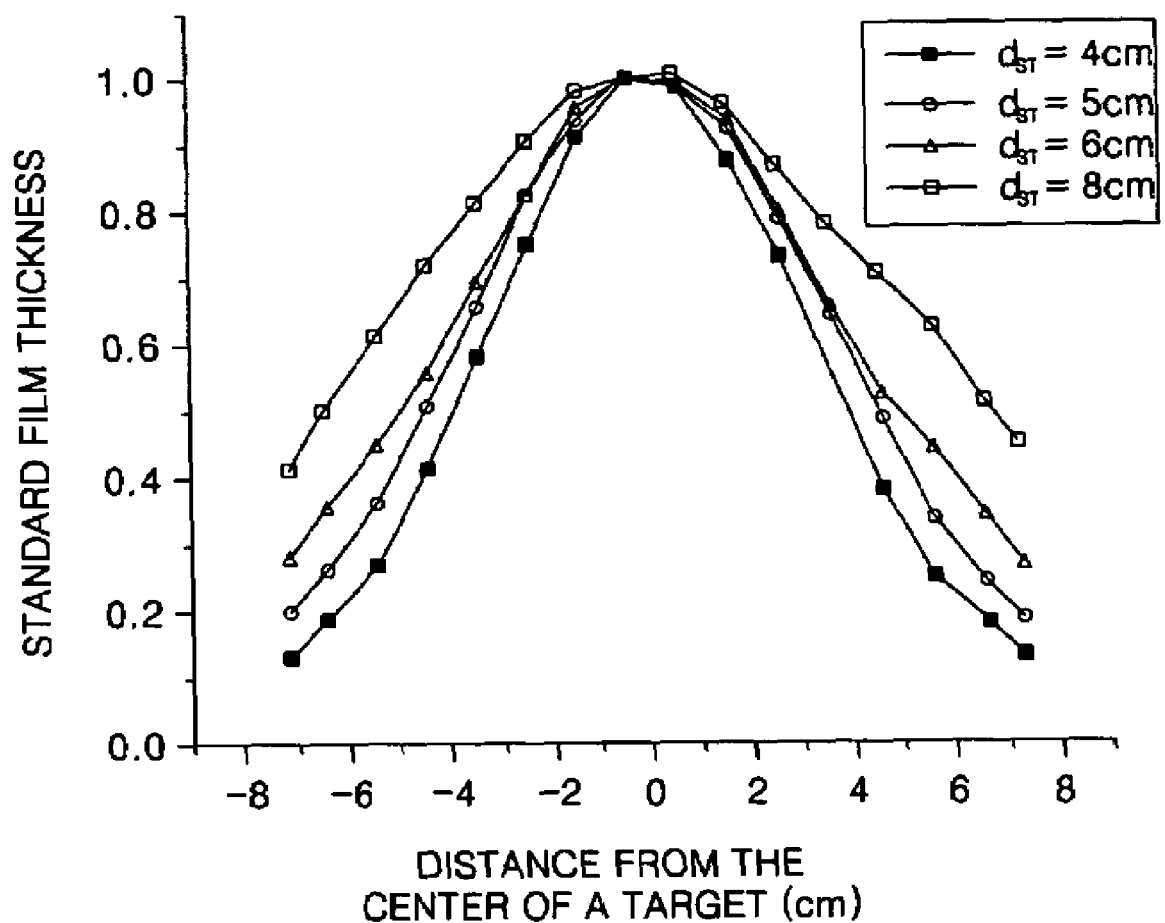
FIG. 10 is a graph of a normalized film thickness according to a distance from the center of a target in a magnetron sputtering apparatus according to the present invention.

FIG. 10 shows a change in standard film thickness according to a distance from the center of a target in a magnetron sputtering apparatus according to the present invention.

For experiments, a target with a width of 2 inch is used and a power of 20 to 400 W is applied. Sputtering is carried out with varying distances ($d_{ST}$) between the target and a substrate, i.e., 4, 5, 6, and 8 cm. As shown in FIG. 10, as $d_{ST}$ increases, the standard film thickness increases. For example, when a RF power is 200 W and $d_{ST}$ is 5 cm, the deposition rate of a $SiO_2$ film is 41.6 nm/min and the deposition rate of a Cu film is 199 nm/min.

Figure 1:
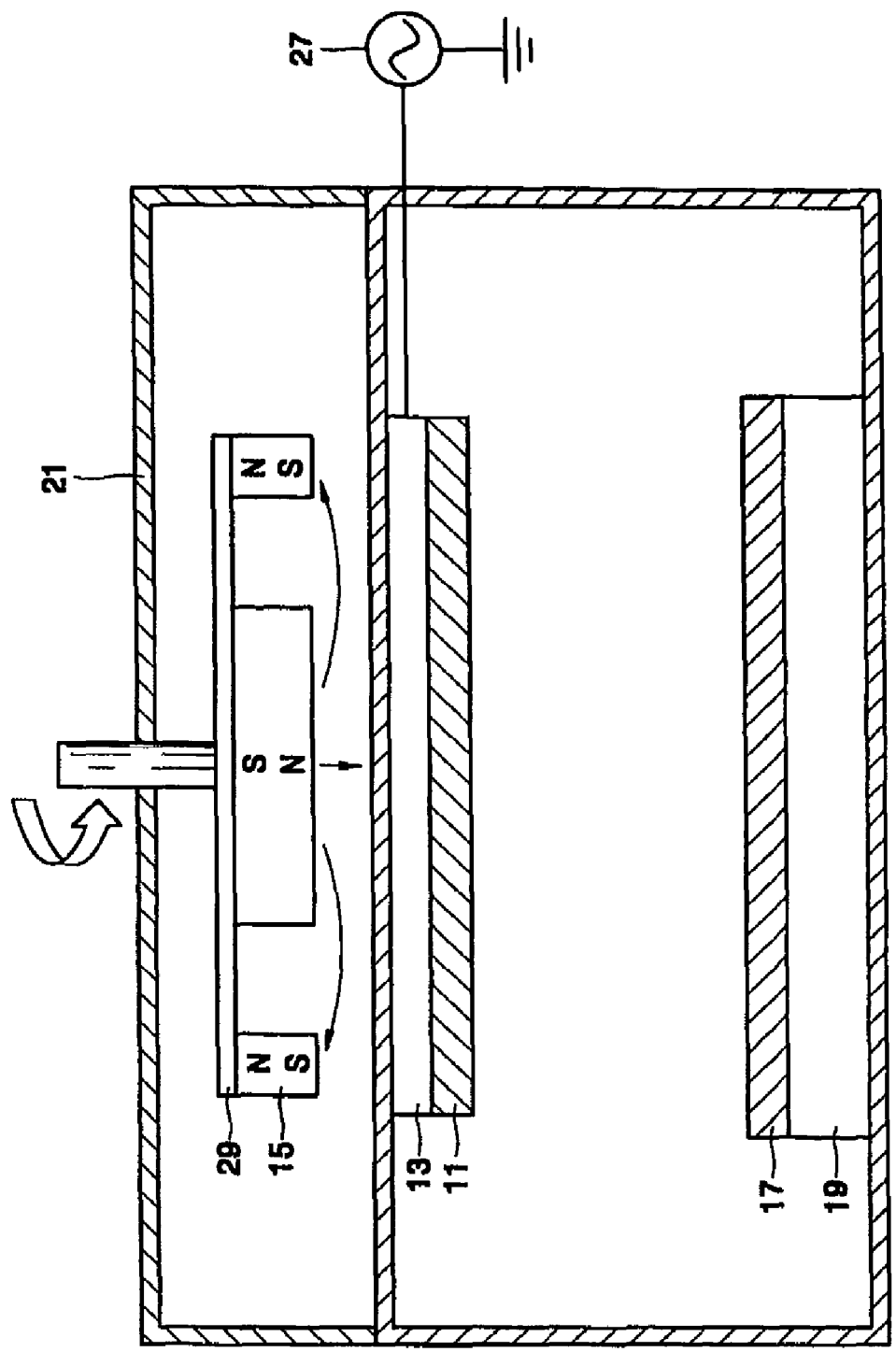
FIG. 1 is a schematic sectional view of a conventional magnetron sputtering apparatus.
Figure 2:
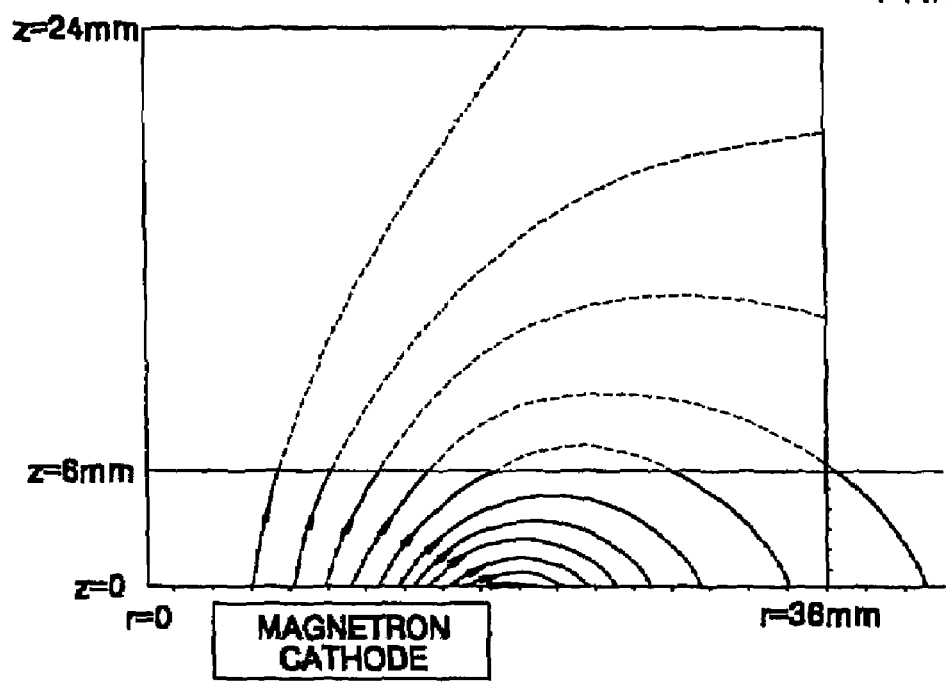
FIG. 2 is a graph of the magnetic field line distribution of a conventional magnetron cathode.
Figure 3:
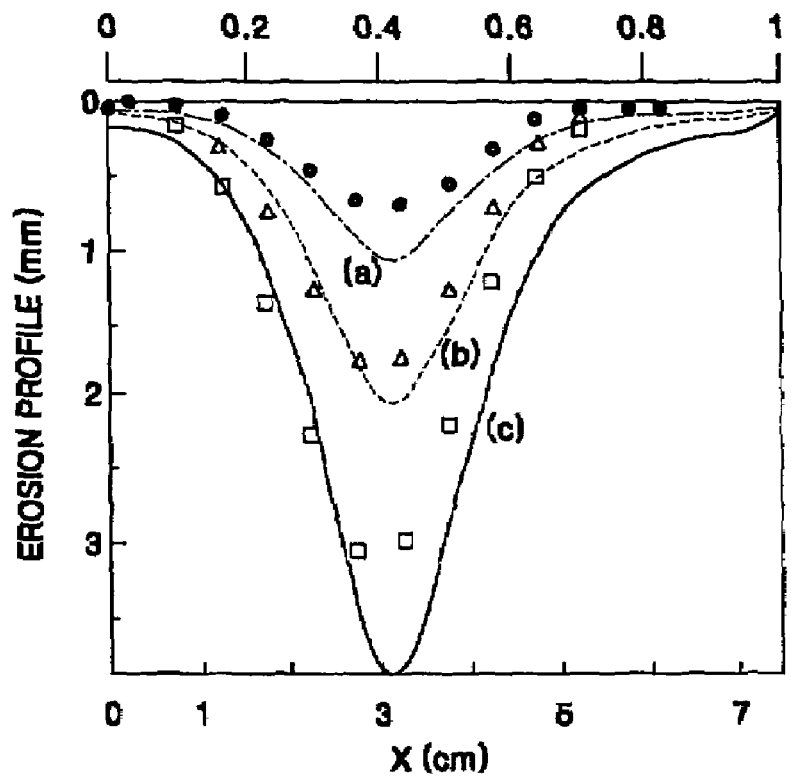
FIG. 3 is a graph of an erosion profile according to a distance from the center (x=0) of a target using the magnetron cathode of FIG. 2.
Figure 4:
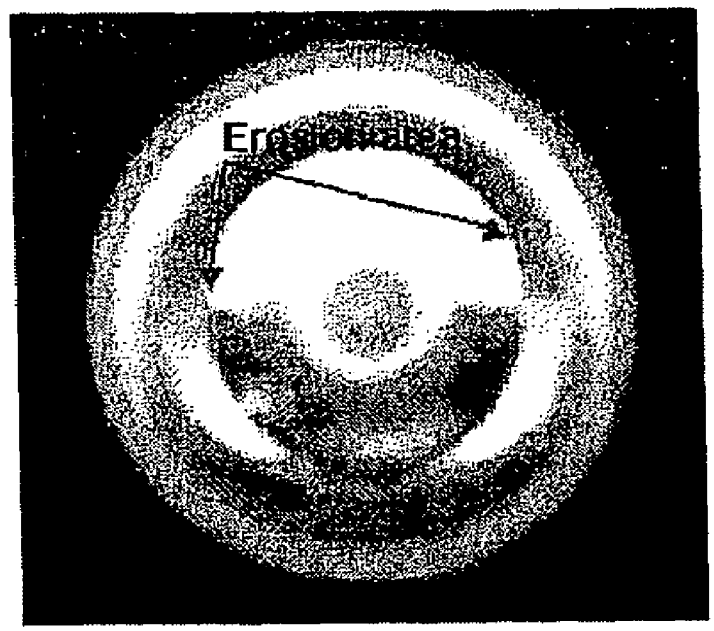
FIG. 4 is a photograph of a target eroded in a conventional sputtering apparatus comprising a conventional magnetron cathode.
Figure 11:
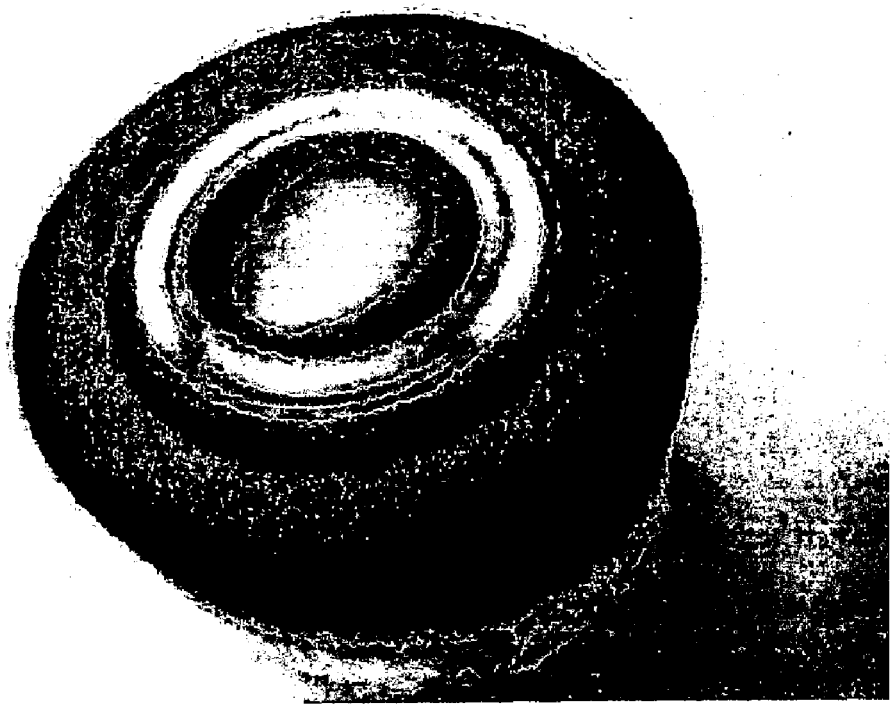
FIG. 11 is a photograph of a target eroded in a magnetron sputtering apparatus according to the present invention.
Figure 12:
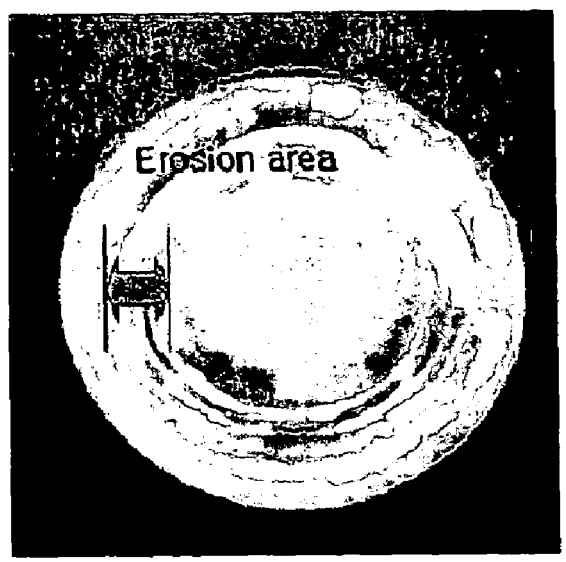
FIG. 12 is an enlarged photograph of the erosion profile of the target of FIG. 11.

FIGS. 11 and 12 are photographs of targets eroded in a magnetron sputtering apparatus according to the present invention. Referring to FIGS. 11 and 12, a ring-shaped erosion area is observed at a predetermined distance from the center of the target. In comparison between the erosion profiles of FIGS. 11 and 12 and the erosion profile of FIG. 4, the erosion profiles of the former according to the present invention has a wider width, when compared to the conventional erosion profile of the latter. From the result, it can be seen that a magnetron cathode according to the present invention can provide the uniform erosion of a target.

As is apparent from the above description, a magnetron sputtering apparatus according to the present invention comprises a magnetron cathode comprised of three or more magnet units in which adjacent magnet units have opposite poles facing toward the same direction. Therefore, the uniform erosion profile of a target is accomplished and a film deposition rate is enhanced. Also, low temperature deposition on a flexible substrate is possible. In addition, even when a magnetron cathode rotates, erosion profile characteristics can be kept constant.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A magnetron cathode, comprising:
   a first magnet unit; and
   at least two peripheral magnet units, each peripheral magnetic unit selectively disposed around the first magnet unit,
   wherein each magnet unit of the first and peripheral magnet units includes at least one magnet, and in adjacent magnetic units like magnetic poles of the at least one magnet are oriented in opposite directions.

2. The magnetron cathode according to claim 1, wherein the first and peripheral magnet units are substantially symmetrically disposed around the same axis.

3. The magnetron cathode according to claim 1, wherein the first magnet unit has a hollow cavity inside thereof.

4. The magnetron cathode according to claim 1, wherein at least one of the first and peripheral magnet units is formed in a circular shape.

5. The magnetron cathode according to claim 1, wherein at least one of the first and peripheral magnet units is formed in a polygonal shape.

6. The magnetron cathode according to claim 4 or 5, wherein each of the first and peripheral magnet units comprises one or more magnets having poles of like polarity oriented in substantially the same direction.

7. A magnetron sputtering apparatus, comprising:
   a first electrode for supporting a substrate to be sputtered onto;
   a magnetron cathode including a sputtering target and a second electrode coupled to the sputtering target, the magnetron cathode having a first magnet unit and at least two peripheral magnet units selectively disposed around the first magnet unit; and
   a support member supporting the magnetron cathode, wherein each magnet unit of the first and peripheral magnet units includes at least one magnet, and in adjacent magnetic units like magnetic poles of the at least one magnet are oriented in opposite directions.

8. The magnetron sputtering apparatus according to claim 7, wherein the first and peripheral magnet units are substantially symmetrically disposed around the same axis.

9. The magnetron sputtering apparatus according to claim 7, wherein the first magnet unit has a hollow cavity defined by the support member.

10. The magnetron sputtering apparatus according to claim 9, further comprising a tube for providing cooling water to the hollow cavity.

11. The magnetron sputtering apparatus according to claim 7, wherein at least one of the first and peripheral magnet units is formed in a circular shape.

12. The magnetron sputtering apparatus according to claim 7, wherein at least one of the first and peripheral magnet units is formed in a polygonal shape.

13. The magnetron sputtering apparatus according to claim 7, wherein each of the first and peripheral magnet units comprises one or more magnets having poles of like polarity oriented in substantially the same direction.

14. The magnetron sputtering apparatus according to claim 8, wherein each of the first and peripheral magnet units comprises one or more magnets having poles of like polarity oriented in substantially the same direction.

15. The magnetron sputtering apparatus according to claim 7, wherein a distance between the substrate and the sputtering target is about $1/4$ or less of a width of the sputtering target.

16. The magnetron sputtering apparatus according to claim 7, further comprising a nozzle disposed near the sputtering target and adapted to supply an inert gas.

17. The magnetron sputtering apparatus according to claim 7, wherein the first electrode is configured as an anode of the sputtering apparatus and the second electrode is configured as a cathode of the sputtering apparatus.

* * * * *